United States Patent [19]
Martin

[11] 4,107,651
[45] Aug. 15, 1978

[54] GLITCH DETECTOR
[75] Inventor: William Donald Martin, Colorado Springs, Colo.
[73] Assignee: Hewlett-Packard Company, Palo Alto, Calif.
[21] Appl. No.: 740,266
[22] Filed: Nov. 8, 1976
[51] Int. Cl.² ................ H01J 29/52; G06F 11/00
[52] U.S. Cl. .................. 340/146.1 R; 315/383; 324/184; 340/324 A
[58] Field of Search .......... 340/146.1 R, 324 A; 307/236; 328/118; 315/383; 324/184

[56] References Cited
U.S. PATENT DOCUMENTS

| | | | |
|---|---|---|---|
| 3,387,084 | 6/1968 | Hine et al. | 340/324 A |
| 3,423,627 | 1/1969 | Hansen et al. | 315/383 |
| 3,469,252 | 9/1969 | Bet | 340/324 A |
| 3,474,438 | 10/1969 | Lauher | 340/324 A |
| 3,541,355 | 11/1970 | Kan | 307/236 |

Primary Examiner—Charles E. Atkinson
Attorney, Agent, or Firm—Michael L. Sherrard

[57] ABSTRACT

A method and circuit for detecting spurious transitions ("glitches", herein) upon a digital signal utilizes a test for such a glitch condition dependent upon the digital signal level and upon the polarity of subsequent transitions within a discrete sampling period to allow for the detection of any type of glitch. A simultaneous display for the sampled digital data and for the detected glitch information further allows a convenience to an operator analyzing the data. Further, the glitch detector is used as a trigger for retrieving selected portions of the sampled digital signal.

3 Claims, 6 Drawing Figures

PRIOR ART

GLITCH DETECTOR

BACKGROUND AND SUMMARY

In most digital systems, failures arise which require a timing examination of certain signals. In many cases, these failures are caused by spurious transitions or "glitches" on a digital signal. This invention allows detection of these glitches without altering the apparent timing characteristics of the signal or signals under test.

One previous method of glitch detection relies on a technique referred to as pulse-stretching. This technique is very simple to implement and is very useful in some applications. However, it lacks in two areas which may mislead the user and cause erroneous conclusions. First, the technique does not detect some types of glitches. Secondly, the technique does not distinguish glitches from the sampled data. To understand the reasons for this, consider the method in which the pulse-stretcher operates.

Without a pulse-stretcher, the system making the measurement samples the signal at each sampler clock edge as shown in FIG. 1. Since the glitch on the signal under test occurred between clock edges, the glitch was not sampled. With a pulse-stretcher, the glitch is "stretched" sufficiently to allow the next available clock (at $T_1$) to sample the stretched glitch.

To understand why the pulse-stretcher fails to detect some glitches, refer to FIG. 2. The pulse-stretcher recognizes the negative transition at time $T_1$ on the signal under test and "stretches" the low level until the sampler clock occurs at $T_2$. Any activity on the signal that occurs between $T_1$ and $T_2$ is ignored. Therefore, the glitch on the signal under test is not detected.

Since the pulse-stretcher modifies the signal under test to allow glitches to be sampled, there is no way of separating the glitch information from the signal information that was actually present at the sampler clock time. When many channels of information are being viewed simultaneously, it is often difficult to distinguish the glitches from the ordinary data pattern.

The Hewlett-Packard 5000A Logic Analyzer uses a second method of glitch detection. It uses what is termed a spike detector and defines a spike as two or more transitions within a clock period. This method allows the glitch indicated in FIG. 2 to be detected. Note that the period between consecutive clock pulses at $T_0$ and $T_2$ contains three transitions, thereby indicating that a glitch occurred. The spike detector also allows the glitch information to be distinguished from the sampled data since the glitch information can be stored in a different memory. However, because of the type display used in the 5000A, both glitch information and sampled data may not be displayed simultaneously. The spike detector also fails to detect a certain type of glitch. Referring to FIG. 3, a transition on the signal under test occurs just prior to the sample clock edge ($T_2$). The latch that samples the signal under test does not necessarily latch the data that is present at the clock sampler edge. Because of the set-up and hold time of the latch, the data that is captured is likely the data that was present a few nanoseconds prior to the sampler clock edge ($T_1$). Therefore, the sampler clock edge at $T_3$ captures a low signal, as does the sample edge at $T_0$ and $T_4$. Note also that only one transition occurs in the time interval between $T_0$ and $T_3$, and only one transition occurs in the time interval between $T_3$ and $T_4$. Therefore, the glitch is neither sampled by the sampler clock nor detected by the spike detector.

It is therefore an object of the present invention to detect spurious transitions upon a sampled signal.

It is further object of the present invention to provide a simultaneous display of the sampled data and the glitch information.

It is a further object of the present invention to provide a trigger upon the detection of a glitch for retrieving selected segments of the sampled data and the glitch information.

These and other objects are accomplished in accordance with the present invention by a unique definition of a glitch, a method and circuitry for detecting the defined glitch condition without alteration of the signal under test, and a simultaneous display of the sampled data and glitch information.

DETAILED DESCRIPTION

The present invention defines glitch by either of the following two conditions:

(1) If a high level is sampled by the sampler clock that occurs at time $T_n$, and a positive transition occurs upon the signal under test in the following sampler clock period; or (2) If a low level is sampled by the sampler clock that occurs at time $T_n$, and a negative transition occurs upon the signal under test in the following sampler clock period.

Figure 1:
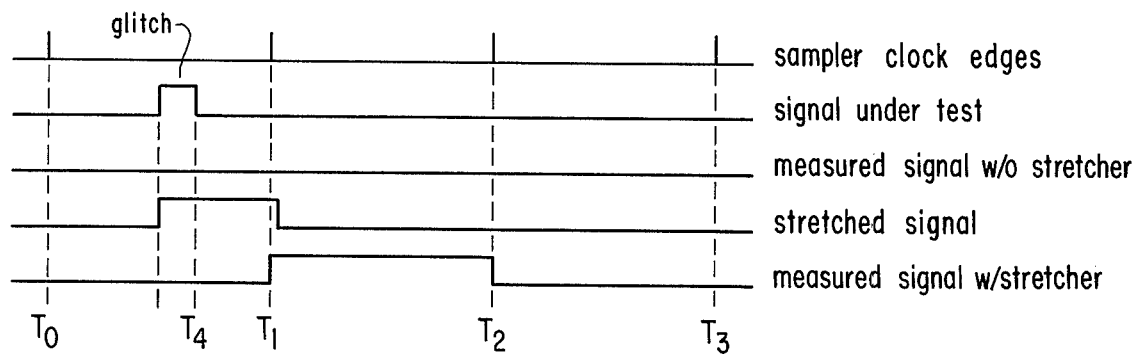
FIG. 1 is an illustration of signals portraying the operation of a prior art pulse stretcher.
Figure 2:
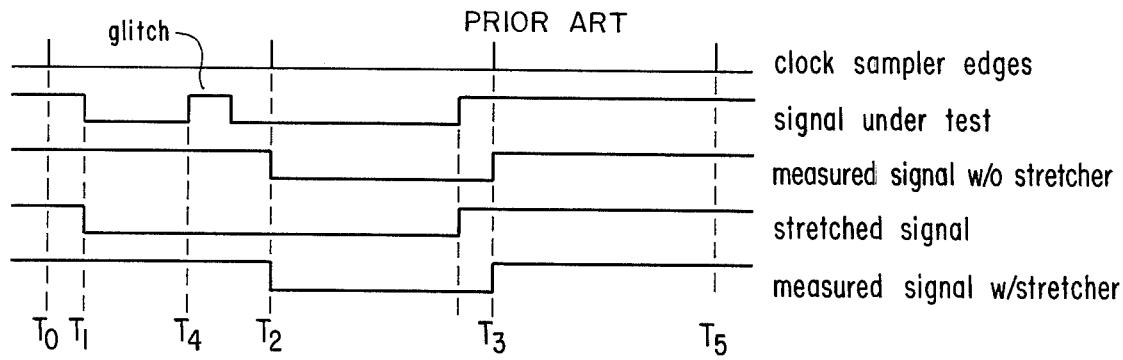
FIG. 2 is an illustration of signals demonstrating a prior art pulse stretcher missing a glitch.
Figure 3:
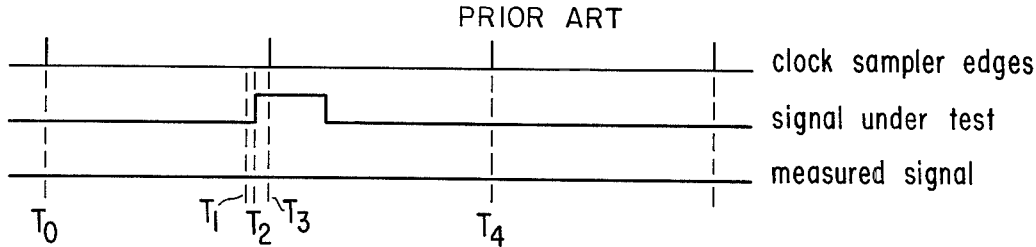
FIG. 3 is an illustration of signals demonstrating a prior art spike detector missing a glitch.

Consider the three glitches discussed earlier. In FIG. 1, the sampler clock at $T_0$ latches a low level and a negative transition is detected in the following clock period at time $T_4$, thereby defining the glitch. In FIG. 2, a high level is detected at $T_0$ and a positive transition is detected in the following clock period at time $T_4$, thereby defining the glitch. In FIG. 3, the sampler clocks at $T_0$ and $T_3$ latch low levels. Only a positive transition is detected in the clock period following $T_0$, thereby not indicating a glitch. However, a negative transition is detected in the clock period following $T_3$, thereby defining the glitch.

It can now be appreciated that the present invention detects any spurious transitions or glitch not detected by the sampler clock without affecting the signal under test.

Figure 4:
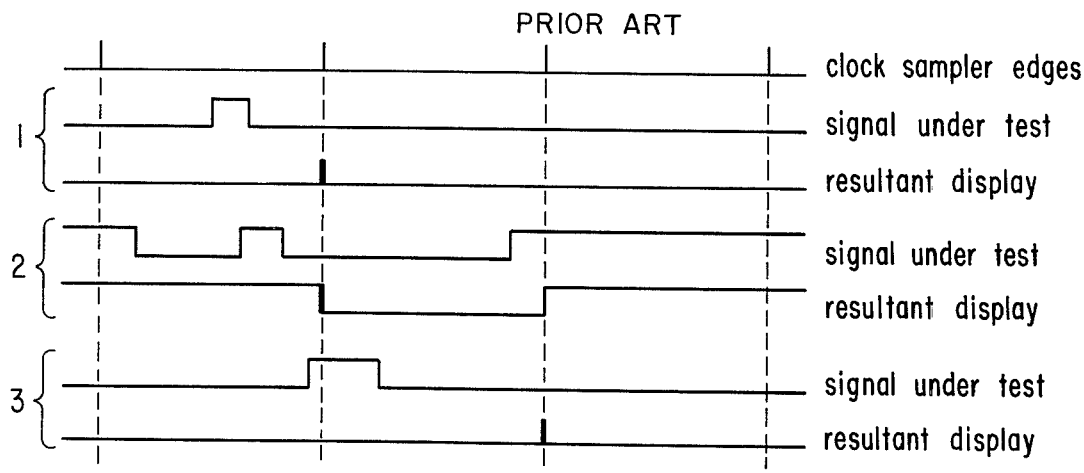
FIG. 4 is the simultaneous display of sampled data and glitches by the present invention.

A cathode ray tube is used to display the sampled data and the glitch information simultaneously. Glitches are indicated by illuminating the sampler clock edge subsequent to the detection of a glitch. The glitch information is superimposed on the sampled information. The glitch information is distinguished from the sampled data display by making the intensity of the glitch information greater than the intensity of the sampled information. FIG. 4 shows the resultant display for the three glitches discussed earlier.

Figure 5:
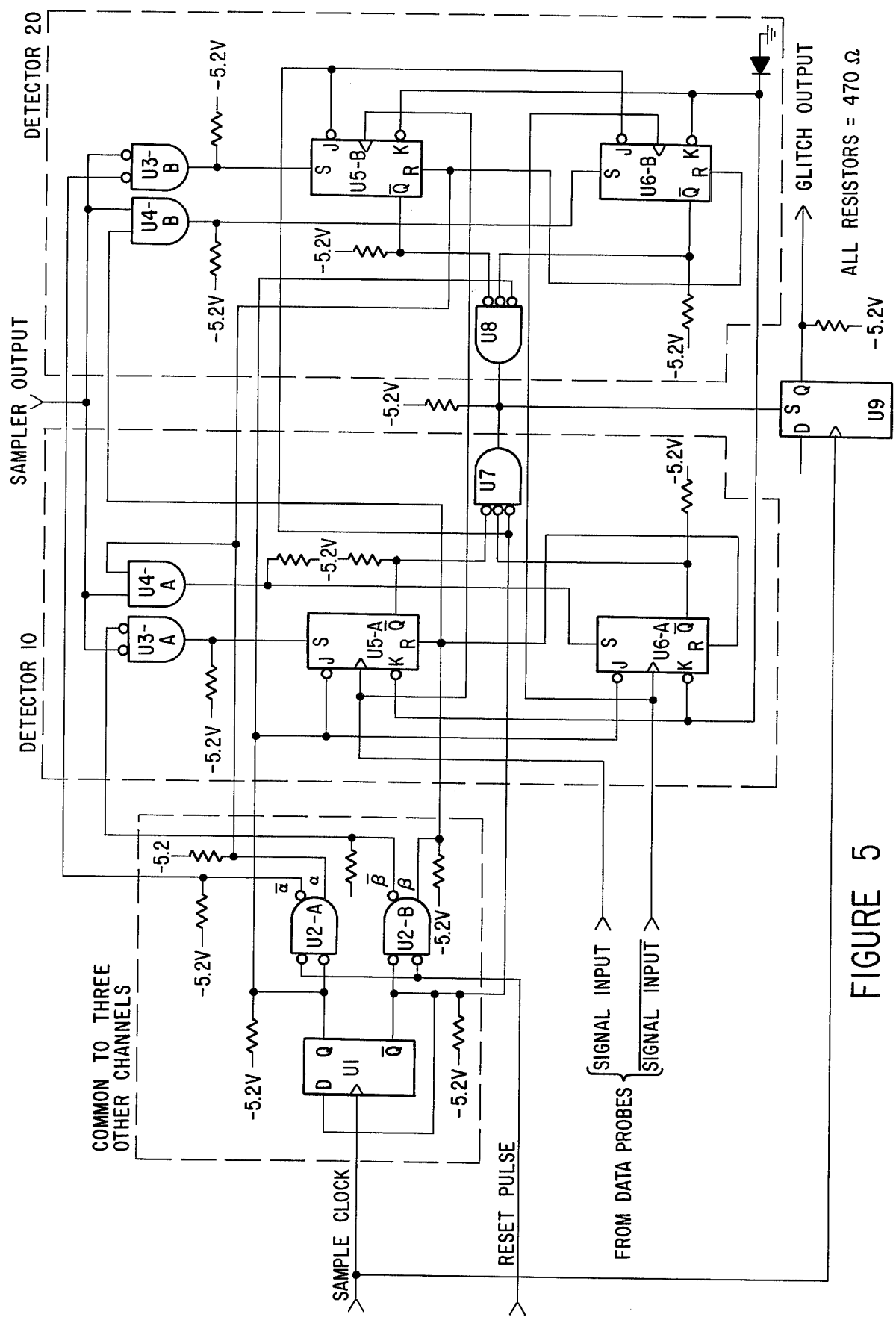
FIG. 5 is a detailed schematic of one channel of the glitch detector constructed in accordance with the present invention.

A detailed schematic of one channel of the glitch detector is shown in FIG. 5. To prevent dead times when the glitch detector is being reset, there are two detectors, detectors 10 and 20 in FIG. 5, for each channel. The detectors are enabled on alternate cycles. This allows one detector to be operational while the other detector is being reset.

Figure 6:
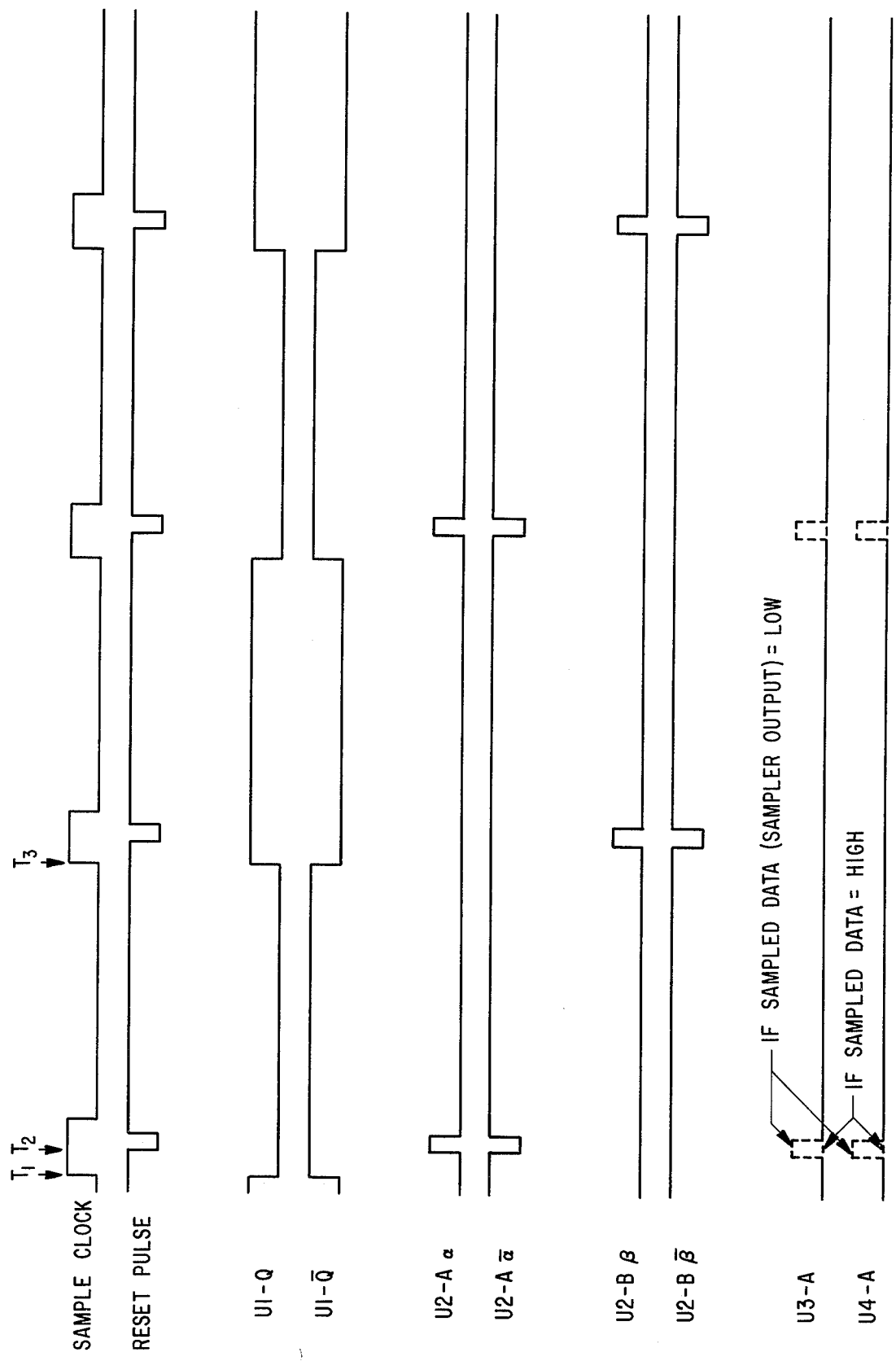
FIG. 6 illustrates selected signals from the circuit in FIG. 5.

The operation of the glitch detector is as follows. Referring also to FIG. 6, an illustration of selected signals, assume that a SAMPLER CLOCK pulse commences at $T_1$ and causes the complementing flip-flop U1 to drive its Q output, U1(Q), to its low state (Low), and its $\bar{Q}$ output, U1($\bar{Q}$), to its high state (High). The application of the low signal from U1(Q) to AND gate U2-A enables the Detector 10 to respond to the SIGNAL INPUT or the SIGNAL INPUT upon the application of a negative RESET PULSE by setting U2-A($\propto$) high and U2-A($\bar{\propto}$) low. This allows AND gate U3-A to respond to a negative sampler output signal or AND gate U4-A to respond to a positive sampler output signal. The high signal from U2-A($\propto$) also resets flip-flops U5-B and U6-B in the Detector 20. The application of the high signal from U1($\bar{Q}$) to AND gate U2-B inhibits the Detector 20 from responding to the SIGNAL INPUT or to the SIGNAL INPUT. Detector 10 operates as follows. If the SAMPLER OUTPUT is high, indicating that the SIGNAL INPUT was high at the sample time $T_1$, then the output from AND gate U4-A will be set high and U6-A(Q) will be set low. U5-A, which was reset (U5-A(Q) high) on the previous cycle, is in a complementing configuration with the negative true J and K inputs both low. The SIGNAL INPUT is applied to the clock input of the JK flip-flop U5-A which is sensitive only to low to high transistions. If a positive transition occurs before the next sample clock occurs, U5-A(Q) will be clocked low, making all the inputs to AND gate U7 low, resulting in a high output from U7 being applied to the set input of U9. The GLITCH OUTPUT is then loaded into memory for later retrieval and display on the CRT.

If the SAMPLER OUTPUT had been low, indicating that the SIGNAL INPUT was low at the sample time $T_1$, then the output from AND gate U3-A will be set high, and U5-A(Q) low. U6-A, which was reset (U6-A(Q) high) on the previous cycle, is in a complementary configuration and will detect a positive transition of SIGNAL INPUT (a negative transition on SIGNAL INPUT) in a manner similar to that described above.

The sequent SAMPLER CLOCK pulse at $T_3$ flips complementing flip-flop U1 output Q high, inhibiting and reseting the Detector 10 and activating detector 20 which operates in a manner similar to the operation of detector 10 described above.

A glitch trigger has been made to take advantage of the glitch detector. The preferred embodiment contains eight timing channels in which glitch detection is employed. The user of the preferred embodiment may define the glitch indication on any one or more of the eight timing channels to trigger the retrieval of selected segments of stored data and/or stored glitches. The user can further qualify triggering on recognition of an eight bit pattern upon the inputs or upon preset delays or a combination of the three. This allows the user the ability to observe selected segments of information on many channels preceeding during or following a particular glitch.

I claim:

1. A circuit for detecting glitches on a digital signal comprising:
    sampling means, coupled to receive the digital signal and having an output, for recurringly sampling the digital signal; and
    detection means, coupled to receive the digital signal and coupled to the output of said sampling means and having an output, for detecting a positive transition upon the digital signal during the interval between sequential samples sequent to sampling of a high level signal on the digital signal, for detecting a negative transition upon the digital signal during the interval between sequential samples sequent to sampling a low level signal on the digital signal, and for providing a signal upon the output responsive to the detection of such transitions.

2. A method for displaying a digital signal and glitches on the digital signal simultaneously, comprising the steps of:
    recurringly sampling the digital signal;
    detecting glitches upon the digital signal;
    displaying the sampled digital signal as a function of time;
    indicating detected glitches by intensifying the display at the time corresponding to the sample subsequent to detection of a glitch.

3. A glitch trigger for a digital signal analyzer comprising:
    sampling means, coupled to receive the digital signal and having an output, for recurringly sampling the digital signal;
    glitch detection means, coupled to receive the digital signal and coupled to the output of said sampling means, for detecting glitches upon the digital signal;
    storage means, coupled to the output of said sampling means and coupled to the output of said glitch detection means, for storing a representation of selected segments of the sampled digital signal and the detected glitches;
    display means coupled to said glitch detection means and coupled to said storage means for displaying a selected segment of the sampled digital signal and the detected glitches in response to the detection of a glitch.

* * * * *

UNITED STATES PATENT AND TRADEMARK OFFICE
CERTIFICATE OF CORRECTION

PATENT NO. : 4,107,651
DATED : August 15, 1978
INVENTOR(S) : William Donald Martin It is certified that error appears in the above-identified patent and that said Letters Patent are hereby corrected as shown below:

Column 3, line 15, cancel "Q" and substitute -- $\overline{Q}$ --;

Column 3, line 15, cancel "(Q)" and substitute -- $(\overline{Q})$ --;

Column 3, line 18, cancel "SIGNAL INPUT" and substitute -- $\overline{\text{SIGNAL INPUT}}$ --;

Column 3, line 20, cancel "($\alpha$)" and substitute -- $(\overline{\alpha})$ --;

Column 3, line 25, "(Q)" and substitute -- $(\overline{Q})$ --;

Column 3, line 27, cancel "SIGNAL INPUT" and substitute -- $\overline{\text{SIGNAL INPUT}}$ --;

UNITED STATES PATENT AND TRADEMARK OFFICE
CERTIFICATE OF CORRECTION

PATENT NO. : 4,107,651
DATED : August 15, 1978
INVENTOR(S) : William Donald Martin It is certified that error appears in the above-identified patent and that said Letters Patent are hereby corrected as shown below:

Column 3, line 31, cancel "(Q)" and substitute -- ($\overline{Q}$) --;

Column 3, line 32, cancel "(Q)" and substitute -- ($\overline{Q}$) --;

Column 3, line 38, cancel "(Q)" and substitute -- ($\overline{Q}$) --;

Column 3, line 46, cancel "(Q)" and substitute -- ($\overline{Q}$) --;

Column 3, line 47, cancel "(Q)" and substitute -- ($\overline{Q}$) --;

Column 3, line 49, cancel "SIGNAL INPUT" and substitute -- $\overline{\text{SIGNAL INPUT}}$ --;

Signed and Sealed this

Eighteenth Day of March 1980

[SEAL]

Attest:

SIDNEY A. DIAMOND

Attesting Officer     Commissioner of Patents and Trademarks